United States Patent [19]
Lin et al.

[11] Patent Number: 6,077,756
[45] Date of Patent: Jun. 20, 2000

[54] OVERLAY TARGET PATTERN AND ALGORITHM FOR LAYER-TO-LAYER OVERLAY METROLOGY FOR SEMICONDUCTOR PROCESSING

[75] Inventors: Hua-Tai Lin, Tainan; Gwo-Yuh Shiau, Hsinchu; Pin-Ting Wang, Taichung, all of Taiwan

[73] Assignee: Vanguard International Semiconductor, Hsin-Chu, Taiwan

[21] Appl. No.: 09/066,015

[22] Filed: Apr. 24, 1998

[51] Int. Cl.[7] .................................................. H01L 21/76
[52] U.S. Cl. .......................... 438/401; 438/975; 356/401; 257/797
[58] Field of Search .............................. 438/14, 401, 975, 438/FOR 435; 316/401; 257/797

[56] References Cited

U.S. PATENT DOCUMENTS

| | | | |
|---|---|---|---|
| 5,087,537 | 2/1992 | Conway et al. | 430/15 |
| 5,365,072 | 11/1994 | Turner et al. | 250/491.1 |
| 5,414,519 | 5/1995 | Han | 356/401 |
| 5,498,500 | 3/1996 | Bae | 430/22 |
| 5,633,505 | 5/1997 | Chung et al. | 250/491.1 |

Primary Examiner—Kevin M. Picardat
Attorney, Agent, or Firm—George O. Saile; Stephen B. Ackerman

[57] ABSTRACT

Novel overlay targets and an algorithm metrology are provided that minimize the overlay measurement error for fabricating integrated circuits. The method is particularly useful for accurately measuring layer-to-layer overlay on a substrate having material layers, such insulating, polysilicon, and metal layers that have asymmetric profiles over the overlay targets resulting from asymmetric deposition or chemical/mechanically polishing. The novel method involves forming a triangular-shaped first overlay target in a first material layer on a substrate. A second material layer, having the asymmetric profile is formed over the first material layer. During patterning of the second material layer, smaller triangular-shaped second overlay target are etched. The vertices of the smaller second overlay targets are aligned to the midpoints of the sides of the first overlay target, which are less sensitive to the asymmetries in the second material layer. An algorithm is then used to determine the positions of the centroids of the first and second overlay targets, which coincide with perfect alignment. The distance between the two centroids is the degree of layer-to-layer misalignment of the two material layers.

21 Claims, 3 Drawing Sheets

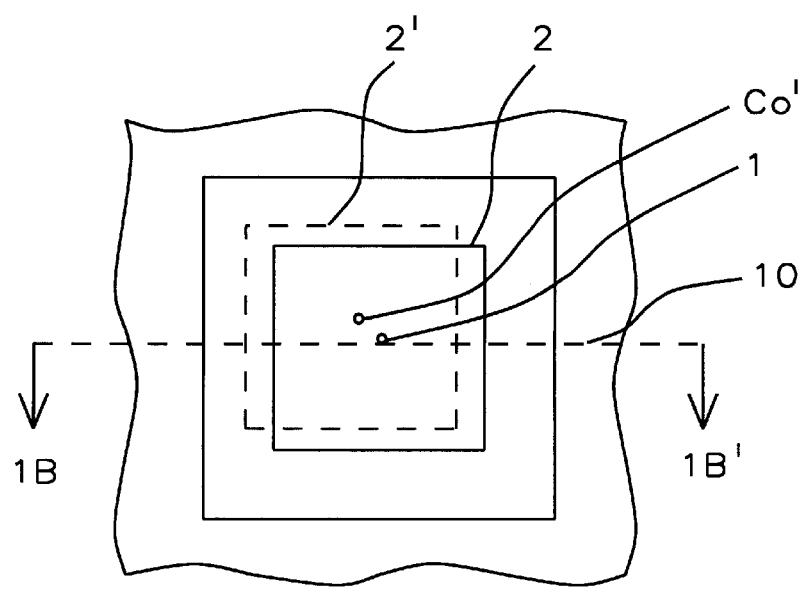
FIG. 1A – Prior Art
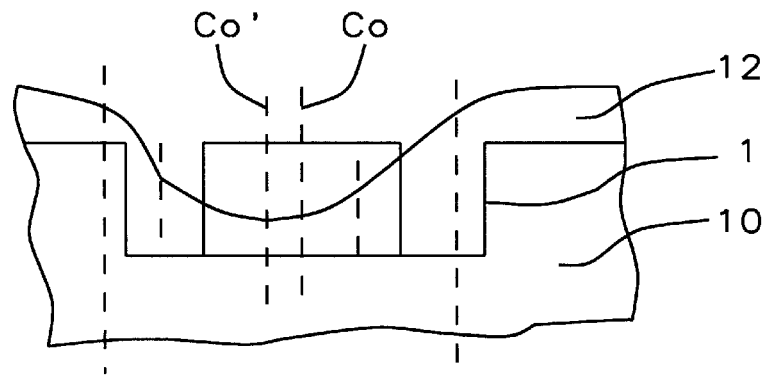
FIG. 1B – Prior Art
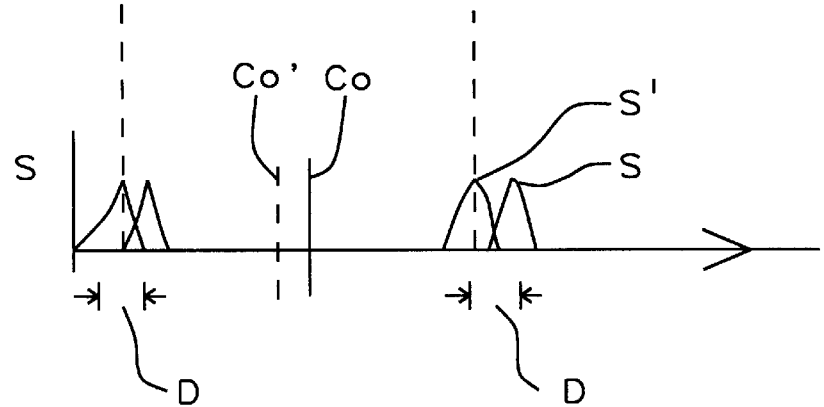
FIG. 1C – Prior Art

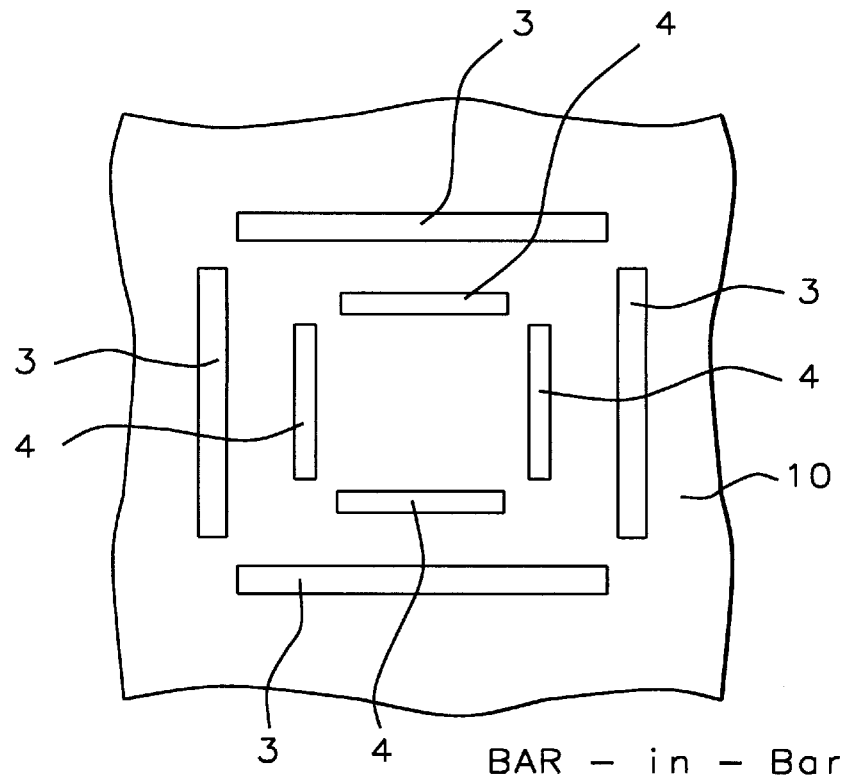
FIG. 2 Prior Art
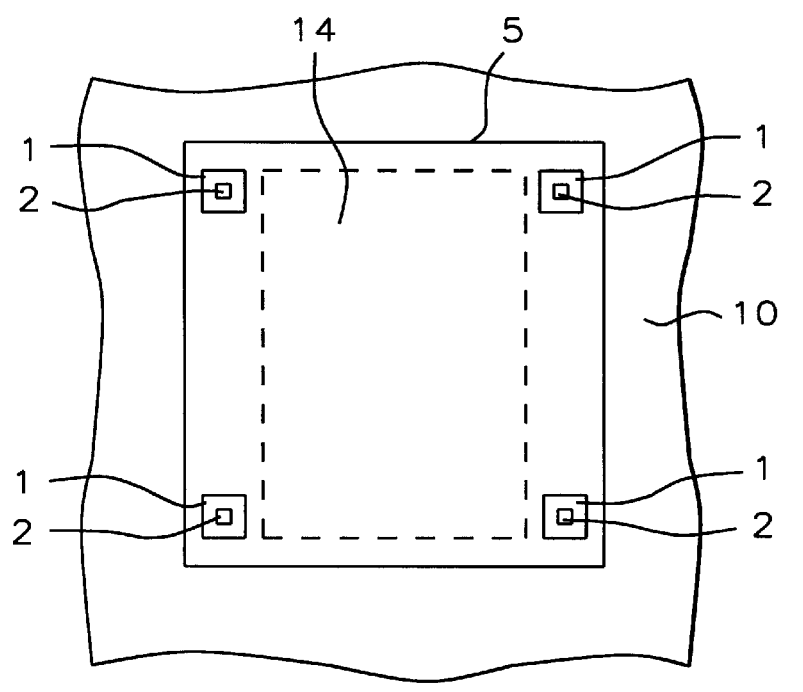
FIG. 3 - Prior Art

OVERLAY TARGET PATTERN AND ALGORITHM FOR LAYER-TO-LAYER OVERLAY METROLOGY FOR SEMICONDUCTOR PROCESSING

BACKGROUND OF THE INVENTION (1) Field of the Invention

The present invention relates to semiconductor processing for integrated circuits, and more particularly relates to a method for accurately measuring layer-to-layer overlay alignment using improved overlay targets on the substrate and a novel overlay alignment algorithm.

(2) Description of the Prior Art

Semiconductor processing for forming integrated circuits requires a series of processing steps. These processing steps include the deposition and patterning of material layers such as insulating layers, polysilicon layers, and metal layers. The material layers are typically patterned using a photoresist layer that is patterned over the material layer using a photomask or reticle. Typically the photomask has alignment marks or keys that are aligned to alignment marks formed in the previous layer on the substrate. However, as the integrated circuit feature sizes continue to decrease to provide increasing circuit density, it becomes increasingly difficult to measure the alignment accuracy of one masking level to the previous level. This overlay metrology problem becomes particularly difficult at submicrometer feature sizes where overlay alignment tolerances are reduced to provide reliable semiconductor devices.

This overlay metrology problem is further exacerbated by the asymmetries in the profile of the material layer over the alignment mark on the substrate. This asymmetry results in distortion of the detection signal used by the software algorithm to align the mask to the alignment mark by the photoresist exposure tool on the substrate, such as in a step-and-repeat exposure system. Also, this asymmetry in the material layer over the overlay target makes it more difficult to provide an accurate overlay metrology.

These asymmetries in the layer can result from asymmetric depositions and/or chemical/mechanical polishing. For example, the chemical/mechanical polishing is used to planarize the layer, and provides a shallow depth of focus (DOF), which are required for optically exposing distortion-free high-resolution photolithographic images. Also, the planar surface allows patterning of the next material layer using directional etching (anisotropic plasma etching) without leaving residue in recesses in the underlying layer.

To better appreciate the metrology alignment problem, top views of some prior-art overlay targets metrologies are depicted in FIGS. 1A and 2. In FIG. 1A, a typical Box-in-Box overlay target 1 is shown, for example by forming a recessed area in a material layer 10 on the substrate, as depicted in the cross section in FIG. 1B. Ideally, a corresponding smaller box 2 on the photomask or reticle is aligned to the larger box 1 so that the centers $C_O$ of the large and small boxes are aligned. However, when an asymmetric layer 12 is formed over the overlay target 1, the edge detection signal S from the edge of the overlay target 1 is shifted to S' resulting in a misalignment of D, as shown in FIG. 1C for a scan across the overlay target.

FIG. 1C shows the cross section 1B–1B' of FIG. 1A. This also results in misalignment of the center of the box from $C_O$ to $C_O'$ as depicted in FIGS. 1A–1C. The misalignment along 1B–1B' between the centers can be expressed as $D=(C_O-C_O')$ and results from an error in the edge detection signal that is provided to the software algorithm for measuring the alignment. FIG. 2 shows an alternative Bar-in-Bar overlay target where the overlay target alignment bars 4 on the photomask or the etched image in layer 12 are aligned to the overlay target alignment bars 3 etched in layer 10 on the substrate. This alignment measurement is also susceptible to edge detection error similar to the Box-in-Box alignment metrology.

FIG. 3 shows a typical reticle 5 used in a step-and-repeat tool to expose and pattern the photoresist layer in area 14 to form the integrated circuits for each chip. The reticle (or mask) 5 is then stepped across the substrate (wafer) to fabricate an array of integrated circuits on the substrate. The alignment mark 2 on the reticle 5, such as the Box-on-Box alignment mark, is aligned to the alignment mark 1 in a kerf area 6 on the substrate along the perimeter of the reticle 5. The alignment algorithm is then used to align the alignment mark 2 to the alignment mark 1 in layer 10 on the substrate. Unfortunately, if the underlying layer 10 is asymmetric over the alignment mark 1, then misalignment can occur, and therefore it is desirable to have an overlay metrology that can more accurately measure this alignment error.

Several methods of improving the measurement and alignment metrologies have been reported. Chung et al. in U.S. Pat. No. 5,633,505 teach a method for checking the overlay alignment for the global alignment, in which subsequent masks are aligned to global alignment marks on the periphery of the substrate. Another method by Bae in U.S. Pat. No. 5,498,500 teaches a method for utilizing the overlay alignment marks to determine the overlay error for multilevels of patterns, and Turner et al. in U.S. Pat. No. 5,365,072 describe a variety of alignment marks for positioning a substrate under a microscope. Conway et al. in U.S. Pat. No. 5,087,537 describe a method using a repetitive pattern of relatively large elements such as rectangles oriented in orthogonal and angular fashion. And a second series of fine lines of varying widths are formed at the next photoresist level over the first pattern. The patterns can then be examined in a scanning electron microscope for alignment and image size. This method is particularly useful for methods of exposing the photoresist that do not use exposure masks, such as electron beam exposure tools.

There is still a need in the semiconductor industry for improved overlay target metrology using novel overlay targets and an algorithm that measures overlay with more accuracy. This includes the need to minimize edge detection errors that can result from a material layer having an asymmetric profile over the overlay target.

SUMMARY OF THE INVENTION

It is therefore a principal object of this invention to fabricate improved overlay targets in material layers on a substrate that allow more accurate measurement of layer-to-layer overlay alignment.

It is another object of this invention to use triangular-shaped overlay targets to provide this improved overlay alignment when the material layer on the overlay target has an asymmetric profile.

Another object of this invention is to provide a means (algorithm) to measure the overlay accuracy between successive layers using these triangular-shaped overlay targets formed on successive material layers.

These objectives are accomplished by forming triangular-shaped overlay targets on each patterned material layer on the substrate, and then using an algorithm to measure the layer-to-layer overlay alignment accuracy of one patterned layer to the next. This layer-to-layer overlay metrology can be used between any two layers on the substrate, but is particularly useful as an overlay target under material layers that are deposited having asymmetric profiles over the overlay target on the substrate. The method is also very useful for layers that are globally planarized by chemical/mechanical polishing (CMP) or by other planarizing methods, since the planarizing method used to planarize the material layer over the device areas can also result in asymmetric profiles (distorted profiles) in the planarized layer over the much wider overlay targets.

The method begins by providing a substrate having a first material layer. When the first material layer is patterned, a triangular-shaped first overlay target is concurrently formed in the first material layer. When a second material layer is deposited and patterned, a second smaller triangular-shaped overlay target is etched in the second material layer that is aligned over the first overlay target in the first material layer. Now by the method of this invention, the vertices of the smaller triangular-shaped second overlay target are aligned to the midpoints of the sides of the larger triangular-shaped first overlay target. Since the vertices of the second overlay target are aligned to the midpoints of the sides of the first overlay target, the alignment is less dependent on the asymmetry of the second material layer over the first overlay target. The centroids, as commonly defined geometrically, of the first and second triangular overlay targets coincide when the patterned second material layer is perfectly aligned to the first overlay target. An algorithm stored in permanent memory is used to determine the distance between the centroids of the first and second triangular-shaped overlay targets. The distance between the centroids is a measure of the misalignment between the patterned second material layer and the patterned first material layer.

The overlay targets are preferably equilateral triangles. However, other triangular-shaped overlay targets can also be used, such as isosceles-shaped triangular overlay targets.

BRIEF DESCRIPTION OF THE DRAWINGS

The objects and other advantages of this invention are best understood with reference to the preferred embodiment when read in conjunction with the following drawings.

FIG. 1A shows a top view of a prior-art Box-in-Box alignment mark depicting the alignment error resulting from a material layer having an asymmetric profile.

FIG. 1B shows a prior-art schematic cross-sectional view for the top view in FIG. 1A depicting a second alignment mark on a photomask superimposed on the substrate alignment mark, and includes a profile of the asymmetric layer.

FIG. 1C shows the edge detection signal for the first alignment mark on the substrate with and without an asymmetric layer for the Box-in-Box alignment mark of FIGS. 1A and 1B, and shows the shift in the detection signal.

FIG. 2 shows a top view of a prior-art Bar-in-Bar alignment mark that is susceptible to the same alignment error as the Box-in-Box alignment marks.

FIG. 3 shows one of the typical reticles, with alignment marks, used in a step-and-repeat exposure tool for fabricating an array of integrated circuit chips.

DESCRIPTION OF THE PREFERRED EMBODIMENT

Figure 4:
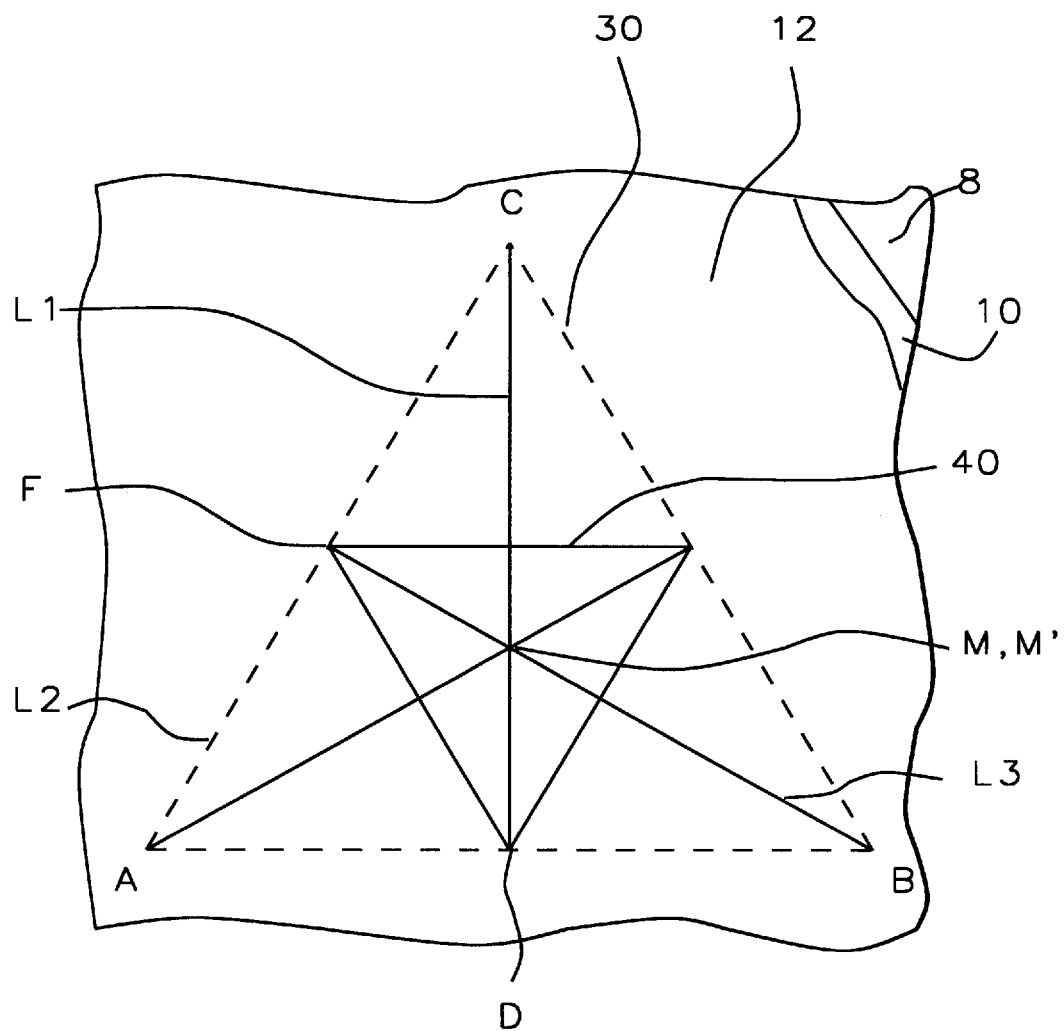
FIG. 4 shows a top view of the present invention for a triangular-shaped overlay target in a second material layer aligned to a larger triangular-shaped overlay target on an underlying first material layer.

Now, by the method of this invention, improved overlay targets and an algorithm for making more accurate layer-to-layer overlay are described in detail with reference to FIG. 4. These overlay targets and algorithm are used to measure the layer-to-layer fine alignment accuracy of each chip device area. However, it should also be well understood by those skilled in the art that these triangular-shaped overlay targets and associated algorithm can also be used to measure the global or zeroth-order alignment on the substrate.

To better appreciate the advantages of this invention, the method of forming the overlay targets on the substrate 8 is described first, and the algorithm for making the alignment measurements is described. Typically the material layers used in fabricating semiconductor devices are insulating layers, polysilicon layers, or conducting layers, such as silicide or metal layers. These layers are then patterned to form parts of the integrated circuits. Some of these patterned layers are also used as ion implant or diffusion-masking layers to form the diffused regions in the substrate for forming portions of semiconductor devices, such as the source/drain areas on field effect transistors (FETs) and the collector, base, and emitter regions on bipolar transistors. Unfortunately, asymmetric profiles can result from the method of deposition or planarization of these various material layers. This asymmetry over the alignment mark can result in alignment error when exposing the photoresist through a photomask or reticle using the current alignment metrology that relies on the detection signal from the edge of the alignment mark on the substrate. Therefore, it is desirable in the semiconductor industry to provide an overlay metrology that can measure how accurate these alignments are. The method is described for only two consecutive layers on a substrate, but it should also be understood that the method applies to any of the many material layers used to fabricate the semiconductor integrated circuit.

Referring now to the top view in FIG. 4, and by the method of this invention, novel triangular-shaped overlay targets are shown for accurately measuring alignment error. These overlay targets are etched in both the underlying first material layer and on a second material layer during patterning to form the device structures. FIG. 4 shows a much enlarged top view of these two triangular-shaped overlay targets. The smaller second overlay target in the second material layer is aligned over the larger first overlay target in the first material layer. These overlay targets are used in place of the conventional Box-in-Box overlay targets, such as 1 and 2 in FIG. 3, to measure the layer-to-layer overlay accuracy. The first overlay target 30 is formed in layer 10 on the substrate 8 in the kerf area between chip device areas. The overlay target 30 is formed using the same photoresist mask and anisotropic plasma etching used to pattern the first material layer in the chip device area. The preferred overlay target 30 is formed having a triangular shape and is recessed in layer 10 similar to the Box-in-Box overlay target of the prior art shown in FIG. 1B. The preferred shape of the overlay target 30 is an equilateral triangle. And the three sides of the triangle as represented by the lengths A–B, B–C, and C–A are of equal lengths, as depicted in FIG. 4. After forming the triangular-shaped first overlay target 10 in the first material layer 10, a second material layer 12 used in the semiconductor processing is deposited over layer 10 on the substrate 8. For example, layer 12 is one of the commonly used material layers used to fabricate the semiconductor circuit, such as an insulating layer, a polysilicon layer, a conducting layer and the like.

Conventional photolithographic techniques and plasma etching are then used to pattern the material layer 12 over the semiconductor chip device areas and to concurrently form a smaller triangular-shaped second overlay target 40 aligned to and over the first overlay target 30.

A key feature of this invention is that the vertices D, E, and F of the second overlay target 40 are aligned, respectively, to the midpoints of the lines A–B, B–C, and C–A of the first overlay target, as shown in FIG. 4. Since the measurement of alignment is determined by the midpoints of the sides of the overlay target 30, the alignment does not depend strongly on any shift in the detection signal resulting from the asymmetric profile of layer 12 over the edges of the overlay target 30 defined by A–B, B–C, and C–A.

The layer-to-layer overlay metrology used to measure the overlay alignment accuracy is then achieved by providing an algorithm, for example, stored as a computer program and encoded in permanent memory. The algorithm is used to generate the three median lines L1, L2, and L3 (lines drawn from each vertex to the midpoint of the line opposite that vertex) for both triangular-shaped alignment marks 30 and 40. The intersection of the three median lines defined the centroids M and M' of the overlay triangles 30 and 40, respectively, and coincide or intersect at a common point M when the overlay targets are perfectly aligned. When there is alignment error, the degree of misalignment is determined by the distance between M and M', that is the alignment error is (M–M'). This triangular-shaped overlay target metrology is superior to the layer-to-layer square-shaped Box-in-Box metrology of the prior art, which is more strongly dependent on the asymmetry of layer 12 of FIG. 1C.

Although this layer-to-layer overlay metrology is used to measure the alignment accuracy between the first and second material layers (layers 10 and 12), the method can also be used to determine the alignment accuracy of the photoresist mask for etching the second material 12 and, if necessary, the photoresist can be reworked.

Although the overlay targets are preferably equilateral triangles, other triangular-shaped overlay targets can also be used to achieve this improved alignment. For example, isosceles-shaped overlay targets can be used in which two sides of the triangular overlay target are of equal length.

While the invention has been particularly shown and described with reference to the preferred embodiment thereof, it will be understood by those skilled in the art that various changes in form and detail may be made without departing from the spirit and scope of the invention.

What is claimed is:

1. A method for making novel overlay targets on a substrate and a means for measuring patterned layer-to-layer overlay alignment accuracy comprising the steps of:

providing a semiconductor substrate having a patterned first material layer with triangular-shaped first overlay targets recessed in said first material layer;

forming a patterned second material layer on said substrate having etched smaller triangular-shaped second overlay targets aligned over said first overlay targets, the vertices of said smaller triangular-shaped second overlay target aligned to the midpoints of sides of said triangular-shaped first overlay target, whereby the centroids of said first and second triangular overlay targets coincide when perfectly aligned;

providing said means consisting of an algorithm stored in permanent memory for measuring the distance between the centroids of said first and second triangular-shaped overlay targets and where said distance is a measure of misalignment of said patterned second material layer to said patterned first material layer.

2. The method of claim 1, wherein said triangular-shaped first and second overlay targets are equilateral triangular-shaped alignment targets.

3. The method of claim 1, wherein said triangular-shaped first and second alignment targets are isosceles triangular-shaped alignment targets.

4. The method of claim 1, wherein said material layers are polysilicon layers.

5. The method of claim 1, wherein said material layers are conducting layers.

6. The method of claim 1, wherein said material layers are insulating layers.

7. The method of claim 1, wherein said second material layer is a chemically/mechanically polished layer.

8. The method of claim 1, wherein said material layers are composed of any materials used in the fabrication of semiconductor devices.

9. The method of claim 1, wherein said permanent memory is a magnetic storage device and said algorithm is in computer program code.

10. A method for making novel overlay targets on a substrate and a means for measuring patterned layer-to-layer overlay alignment accuracy comprising the steps of:

providing a semiconductor substrate having a patterned first material layer with equilateral triangular-shaped first overlay targets recessed in said first material layer;

forming a patterned second material layer on said substrate having etched smaller equilateral triangular-shaped second overlay targets aligned over said first overlay targets, the vertices of said smaller triangular-shaped second alignment target aligned to the midpoints of sides of said triangular-shaped first alignment target, whereby the centroids of said first and second triangular overlay targets coincide when perfectly aligned;

providing said means consisting of an algorithm stored in permanent memory for measuring the distance between the centroids of said first and second triangular-shaped overlay targets and where said distance is a measure of misalignment of said patterned second material layer to said patterned first material layer.

11. The method of claim 10, wherein said patterned first and second material layers are any two consecutive material layers on a semiconductor integrated circuit on said substrate.

12. The method of claim 10, wherein said material layers are polysilicon layers.

13. The method of claim 10, wherein said material layers are conducting layers.

14. The method of claim 10, wherein said material layers are insulating layers.

15. The method of claim 10, wherein said second material layer is a chemically/mechanically polished layer.

16. The method of claim 10, wherein said material layers are composed of any materials used in the fabrication of semiconductor devices.

17. The method of claim 10 wherein said permanent memory is a magnetic storage device and said algorithm is computer program code.

18. Novel overlay targets on a substrate and a means for measuring patterned layer-to-layer overlay alignment accuracy comprised of:

a semiconductor substrate having a patterned first material layer with triangular-shaped first overlay targets recessed in said first material layer;

a patterned second material layer on said substrate having etched smaller triangular-shaped second overlay targets aligned over said first overlay targets, the vertices of said smaller triangular-shaped second alignment target aligned to the midpoints of sides of said triangular-shaped first alignment target, whereby the centroids of said first and second triangular overlay targets coincide when perfectly aligned;

said means consisting of an algorithm stored in permanent memory for measuring the distance between the centroids of said first and second triangular-shaped overlay targets and where said distance is a measure of misalignment of said patterned second material layer to said patterned first material layer.

19. The structure of claim 18, wherein said first and second triangular-shaped alignment targets are equilateral triangles in shape.

20. The structure of claim 18, wherein said first and second triangular-shaped alignment targets are isosceles triangles in shape.

21. The structure of claim 18, wherein said means is an algorithm encoded in permanent memory that measures the distance between the centroids of said first and second triangular targets and where said distance is a measure of the misalignment of said patterned second material layer to said patterned first material layer.

* * * * *